United States Patent [19]

Eaton, Jr.

[11] 3,965,442
[45] June 22, 1976

[54] CMOS OSCILLATOR
[75] Inventor: Sargent Sheffield Eaton, Jr., Phillipsburg, N.J.
[73] Assignee: RCA Corporation, New York, N.Y.
[22] Filed: Feb. 3, 1975
[21] Appl. No.: 546,418

[52] U.S. Cl. ............................ 331/116 R; 307/313
[51] Int. Cl.² ...................................... H03B 5/36
[58] Field of Search ................. 331/116 R; 307/304, 307/313

[56] References Cited
UNITED STATES PATENTS
3,803,828    4/1974    Keeler et al. .................... 331/116 R
3,838,566   10/1974    O'Connor ....................... 331/116 R Primary Examiner—John Kominski
Attorney, Agent, or Firm—H. Christoffersen; Samuel Cohen

[57] ABSTRACT

An oscillator which includes a complementary symmetry metal oxide semiconductor (CMOS) inverter, a crystal connected between the input and output terminals of the inverter, and input and output capacitors connected to these input and output terminals, respectively. Low power dissipation is achieved by making the input capacitance of much higher value than the output capacitance. Frequency stability is obtained by incorporating a voltage controlled capacitor in the circuit which, in response to a change in operating voltage, changes value in a sense to compensate for the tendency of the oscillator frequency to change.

3 Claims, 7 Drawing Figures

CMOS OSCILLATOR

A crystal controlled oscillator employing complementary symmetry metal oxide semiconductor (CMOS) devices often is employed as the time base for an electronic time-piece. It is desirable in this application to use AT cut crystals designed to operate at a frequency above 1MHz (a commonly used value is roughly 4 MHz). The reason is that such crystals are much less expensive than lower frequency crystals and also more stable (have higher Q's) than the lower frequency crystals. Where the timepiece is small (a wristwatch, for example) and the power source (a battery) is of a limited capacity, the power dissipation of the oscillator must be very low, sufficiently so to obtain a reasonable life expectancy — a year or so, from the battery. It is also, of course, important that the oscillator frequency be stable over a reasonable range of battery voltage. It is known that such stability may be achieved by employing a relatively large output capacitance connected between the output terminal of the oscillator and ground.

The present invention resides, in part, in the discovery that the ratio between the input and output capacitance of the oscillator affects the power dissipation of the oscillator. In particular, it has been discovered that increasing the ratio between the input capacitance and the output capacitance of the oscillator very substantially decreases the power consumption. Unfortunately, it has also been discovered that the decreased power consumption is achieved at the expense of frequency stability as a function of operating voltage. This problem has been solved, in accordance with another aspect of the present invention, by incorporating in the circuit a voltage controlled capacitor which changes value in a sense to compensate for the tendency for the oscillator frequency to change with voltage.

The invention is illustrated in the drawing of which:

Figure 1:
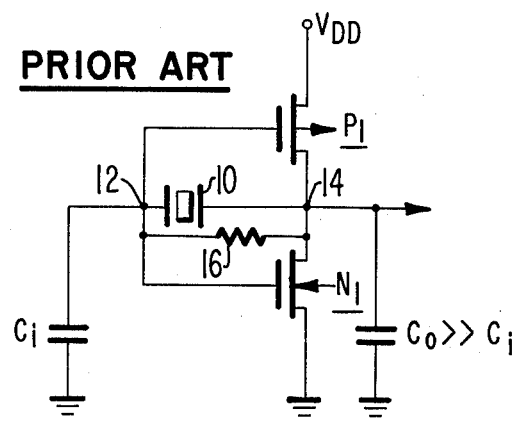
FIG. 1 is a schematic diagram of a known CMOS oscillator.

The known oscillator of FIG. 1 includes a field effect transistor inverter formed of complementary MOS transistors $P_1$ and $N_1$. The conduction paths of these transistors are connected in series between two operating voltage terminals, one at $V_{DD}$ and the other at a second level, ground in this example. The crystal 10 is connected between the input terminal 12 and the output terminal 14 of the inverter. Resistor 16 connects across the crystal. Input capacitor $C_i$ is connected between the input terminal 12 and a point of reference potential, shown as ground, and output capacitor $C_o$ is connected between the output terminal 14 and ground.

It is known in the art that frequency stability may be achieved in the circuit of FIG. 1 by making the output capacitance $C_o$ much larger than the input capacitance $C_i$. If the supply voltage $V_{DD}$ changes by some small amount $\Delta V$, for example, the amplifier phase shift $\phi_a$ also changes and the phase shift through the feedback network $\phi_n$) then also will change to satisfy the condition.

$$\phi_a + \phi_n = 360° \tag{1}$$

It is known that when $\phi_n$ changes, there is also a change in the oscillator frequency. However, if $d\phi_n/df$ of the feedback network is high, this frequency change will be relatively small.

Figure 2:
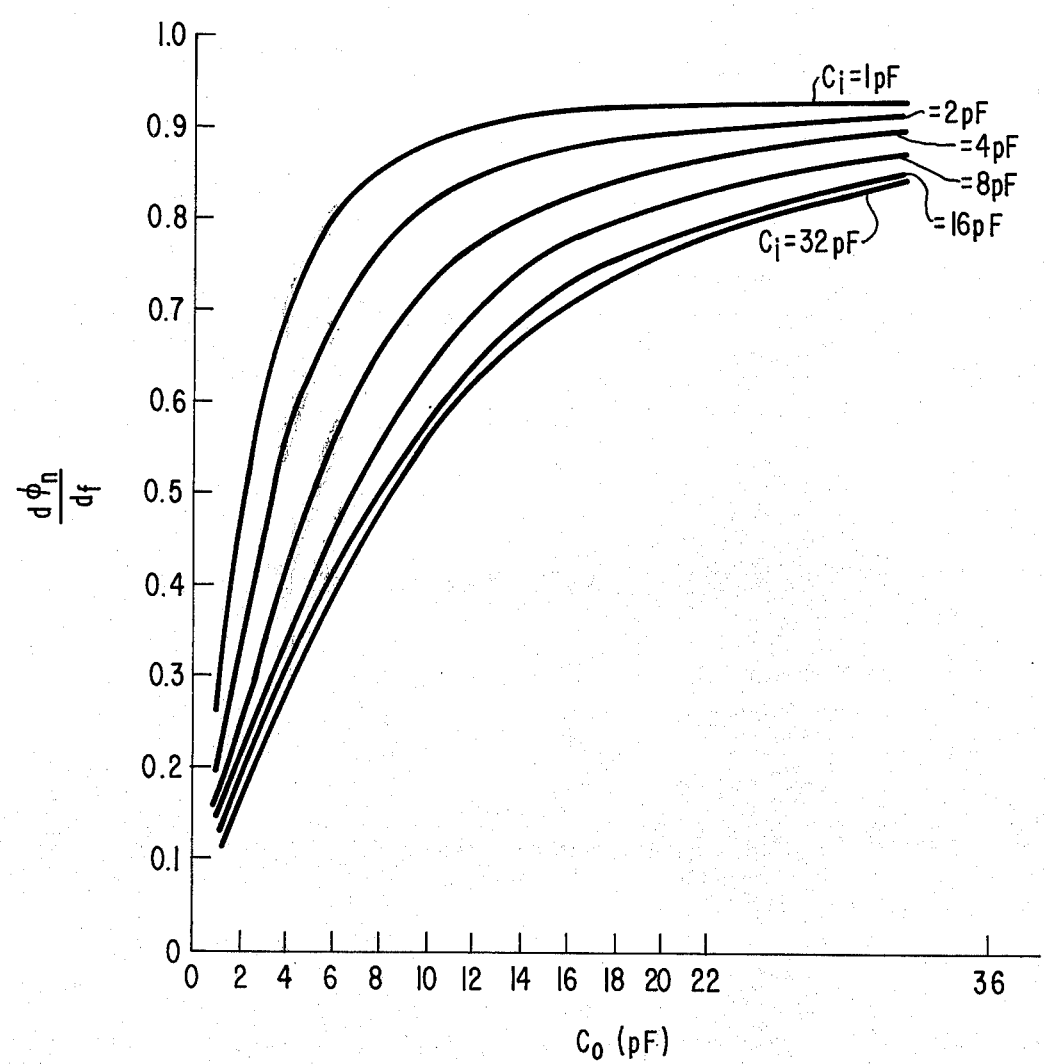
FIGS. 2 and 3 are graphs which illustrate certain operating parameters in the circuit of FIG. 1.

The parameter $d\phi_n/df$ is related to the input capacitance $C_i$ and the output capacitance $C_o$ in the manner shown in FIG. 2. It is clear from this FIGURE that at a given input capacitance, as the output capacitance increases, $d\phi_n/df$ also increases. Put another way, as the ratio between $C_o$ and $C_i$ increases, the parameter $d\phi_n/df$ increases. It is therefore clear that oscillator frequency stability as a function of operating voltage, can be improved by making $C_o$ large and $C_i$ small.

The present inventor has discovered, however, that the above is contrary to the condition required for low power dissipation, that is, for low operating current. It can be shown that the average feedback network current $I_A$ can be defined as:

$$I_A = \frac{V_{DD} f_0}{\left[ \left( \frac{Q}{C_o} - \frac{-Q}{C_o + C_i} \right)^2 + \left( \frac{1}{C_o} \right)^2 \right]^{1/2}} \tag{2}$$

where:

$f_0$ = crystal frequency $$Q = \frac{C_i + C_o}{W_o R\, C_i C_o}$$

$$W_o = \frac{1}{L \left( \frac{C_i C_o}{C_i + C_o} \right)}$$

Figure 3:
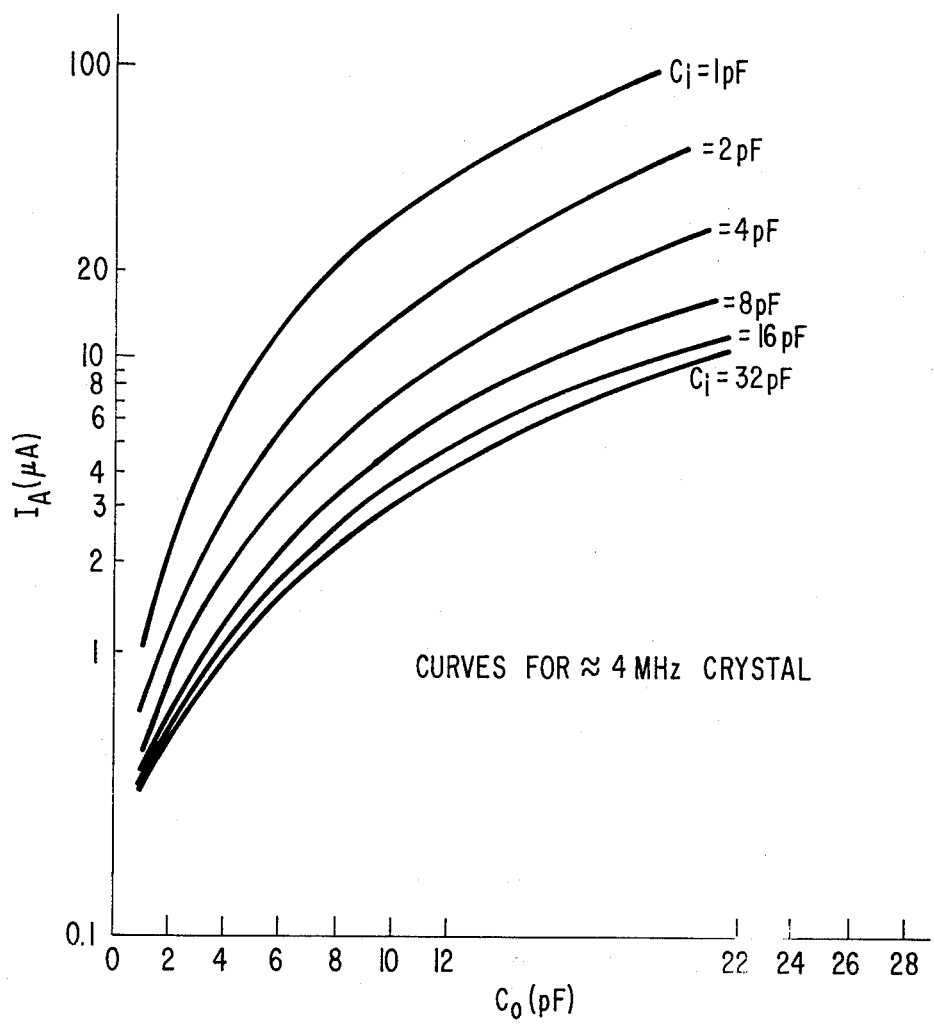

R and L are resistance and inductance parameters associated with the crystal $C_i$ = input capacitance; and $C_o$ = output capacitance Equation 2 is plotted in FIG. 3 for an AT cut, 4 MHz crystal. As is clear from this FIGURE, as the input capacitance increases, the average current $I_A$ in the feedback network decreases. This is quite surprising as one would expect an increase in capacitance to result in an increase in current. It may also be observed from FIG. 3 that very substantial differences in current flow result at different values of input capacitance. For example, at an output capacitance $C_o$ of 10 picofarads (pf) or so, roughly one tenth as much current $I_A$ flows when $C_i$ = 32 pf as when $C_i$ = 1 pf. However, referring back to FIG. 2, the frequency stability (proportional to $d\phi_n/df$) is much lower at $C_i$ = 32 pf than at $C_i$ = 1 pf.

Figure 4:
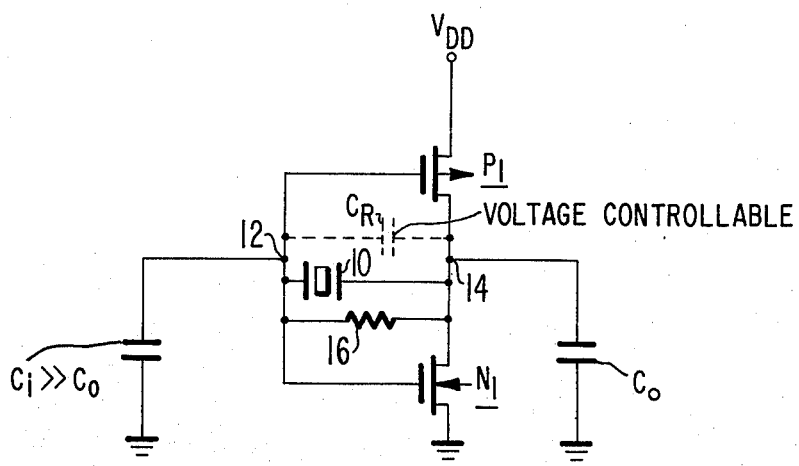
FIG. 4 is a schematic drawing of an improved oscillator in accordance with an embodiment of the invention.

In a circuit according to the present invention, as shown in FIG. 4, the input capacitance $C_i$ is made much much larger than the output capacitance $C_o$ (larger at least by a factor of 10 or so). Unfortunately, as is shown in FIG. 2 this results in relatively poor frequency stability (a relatively low $d\phi_n/df$). In some applications this can be tolerated. However, where high timing accuracy is required, the poor frequency stability with operating voltage is a serious disadvantage.

The present inventor has discovered that this disadvantage may be obviated by including in the circuit a voltage controlled capacitor $C_R$ between the input and output terminals 12 and 14 of the oscillator. In the circuit of FIG. 4, if the voltage $V_{DD}$ should, for example, increase, the phase shift through the amplifier will increase and will approach more closely 180°. As the phase shift $\phi_a$ through the amplifier increases toward 180° (and the phase shift $\phi_n$ through the feedback network corresponding decreases towards −180°) the result is a frequency increase from the oscillator. The voltage controllable capacitor $C_R$, however, increases its capacitance in response to the increase in operating voltage $V_{DD}$. It is particularly convenient to place $C_R$ between the input and output terminals since small changes in this capacitance cause a greater frequency shift than equal changes in $C_o$ and $C_i$. By choosing $C_R$ to be of an appropriate value, the capacitance change in response to $V_{DD}$ can be made to be such that it causes the oscillator frequency to change in a sense opposite to and an amount equal to the change in oscillator frequency caused by the change in $\phi_n$. In other words, $C_R$ changes in a sense and amount to maintain the oscillator frequency reasonably constant even though $V_{DD}$ changes.

Figure 6:
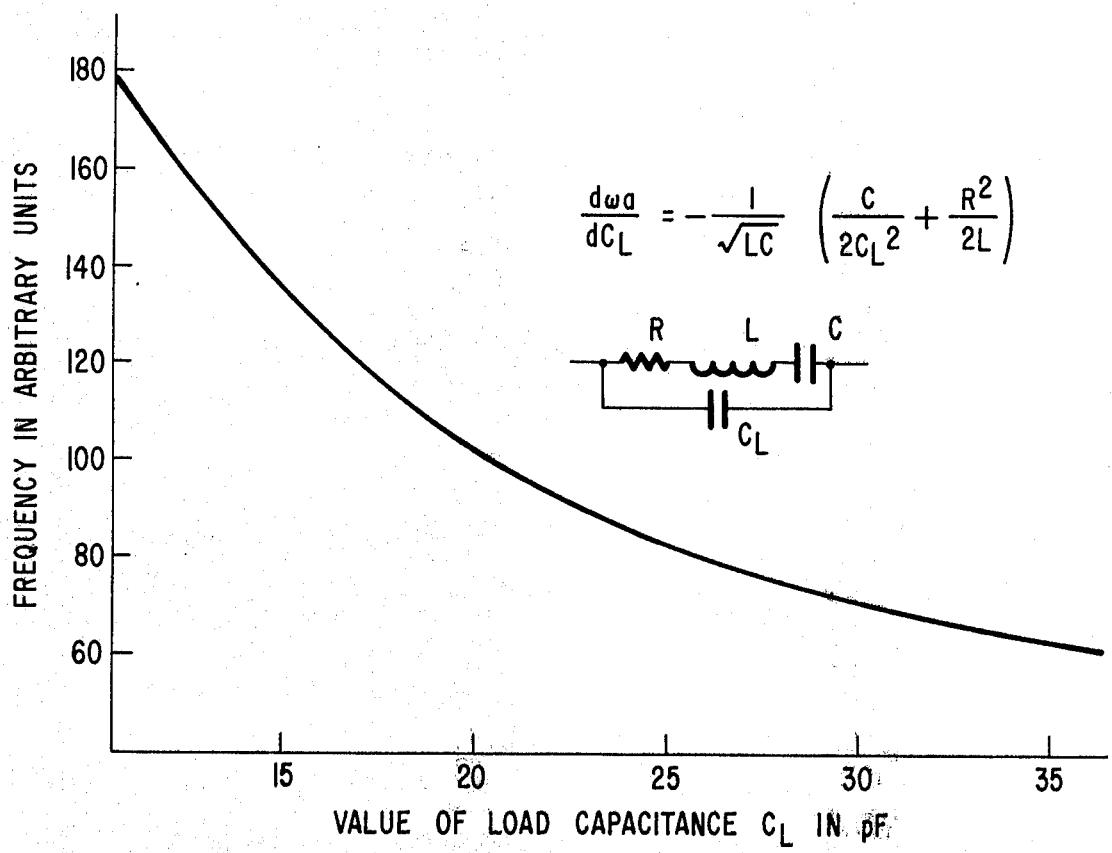
FIGS. 5 – 7 are graphs to help explain the operation of the circuit of FIG. 4.
Figure 5:
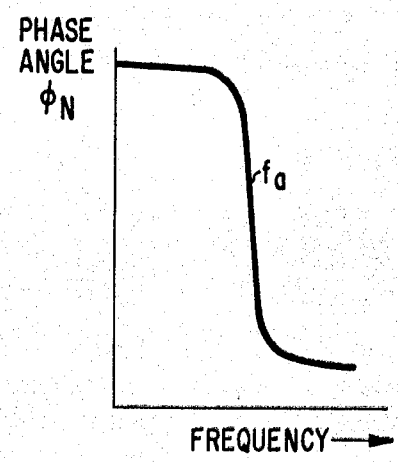

The above is illustrated in FIGS. 5 and 6. FIG. 5 indicates that if the phase angle $\phi_N$ decreases then frequency increases. FIG. 6 is a plot of the change in frequency as a value of the load capacitances of $C_L$. The schematic diagram of this figure is the equivalent circuit of the crystal and $C_L$, interpreted in the light of FIG. 4, includes the capacitance of the voltage controllable capacitor $C_R$. It is clear that if $V_{DD}$ changes (increases, for example,) which tends to cause an increase of the oscillator frequency as illustrated in FIG. 5, that the load capacitance $C_L$ (which includes $C_R$) increases and tends to decrease the oscillator frequency. Thus by choosing an appropriate value of the voltage controllable capacitance, the oscillator frequency can be kept constant over a reasonable range of $V_{DD}$. Ordinarily, the change in $V_{DD}$ is such that the change in $C_L$ required to compensate is generally not more than several picofarads.

The capacitor $C_R$ can be a lumped, voltage controllable capacitor such as a back biased diode, as one example. There are also other possibilities. However, it is preferred to use a distributed capacitance element and this is the reason this capacitor is shown in phantom in FIG. 4. It is particularly convenient to employ the capacitance between the gate electrodes of the P and N devices and the respective conduction channels of these devices. This can be done without changing the length-to-width ratio of each channel. The area of the gate electrode determines the amount of distributed capacitance which is introduced. If, for example, the gate electrode is made wider so that the channel width is increased, the length-to-width ratio of the channel may be retained at its original design value by spacing the source and gate electrodes further apart.

It is important in oscillator applications that the design width-to-length ratio of the respective transistors be retained at their original design value because this parameter determines the oscillator starting voltage. The particular width-to-length ratio which is chosen in any application will depend upon the battery operating voltage and other design criteria.

Figure 7:
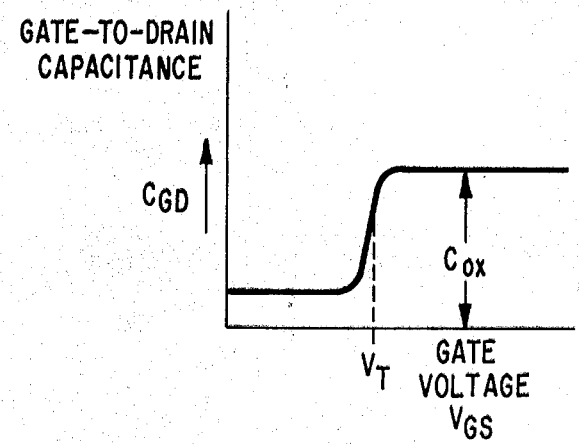

FIG. 7 illustrates the gate-to-drain capacitance $C_{GD}$ of a MOS transistor as a function of the gate to source voltage $V_{GS}$. The maximum capacitance reached, $C_{OX}$, is directly proportional to the width and length of the channel and inversely proportional to the thickness of the channel.

A circuit such as shown in FIG. 4 may have the following circuit parameters:
$C_i = 7$ picofarads
$C_o = 0.3$ picofarads (this is an estimate, as the capacitance employed is a distributed capacitance — that present between point 14 and ground)
16 = 22 megohms
10 = nominally 2.097150 MHz
$P_1$ channel width $(W_{P1}) = 4.8$ mils
$P_1$ channel length $(L_{P1}) = 0.4$ mils
$W_{P1}/L_{P1} = 12$
$N_1$ channel width $(W_{N1}) = 2.4$ mils
$N_1$ channel length $(L_{N1}) = 0.4$ mils
$W_{N1}/L_{N1} =$ The W/L ratio of the P type transistor is double that of the N type transistor to obtain equal source-to-drain current flows, as is understood in the art. The threshold voltage $V_T$ of each device is about 0.5 volt.

The circuit above was operated at different values of $V_{DD}$ and the following results obtained

| $V_{DD}$ | FREQUENCY |
|---|---|
| 2.5 volts | 2.097523 |
| 3.0 volts | 2.097518 |
| 4.0 volts | 2.097521 |

The variation in frequency is roughly ± 1.5 parts per million over the $V_{DD}$ range shown which is very fine indeed.

Care must be taken in the design above not to employ too much capacitance $C_R$ or overcompensation results. For example, it is found that when the channel dimensions are increased as follows to cause a corresponding increase in $C_R$,
$W_{P1} = 12$ mils
$L_{P1} = 1$ mil
$W_{P1}/L_{P1} = 12$
$W_{N1} = 6$
$L_{N1} = 1$
$W_{N1}/L_{N1} = 6$
the results below are obtained:

| $V_{DD}$ | FREQUENCY |
|---|---|
| 2.5 volts | 2.097560 MHz |
| 3.0 volts | 2.097536 MHz |
| 4.0 volts | 2.097506 MHz |

Here the frequency variation is roughly ± 14 parts per million.

Note that in the circuits described above a 2 MHz crystal rather than the 4 MHz crystal mentioned in the introductory portion of the specification; however, the operating principle remains the same. Note also that in each example the oscillator frequency differs from the nominal crystal frequency. This is normal and is a function of the distributed capacitance present in the particular circuit employed.

What is claimed is:
1. An oscillator comprising, in combination:
   two operating voltage terminals,
   two field effect transistors of complementary conductivity types, each having a conduction path and a control electrode, said conduction paths connected in series between said operating voltage terminals, said two control electrodes connected to an input terminal, and the connection between said two conduction paths serving as an output terminal;

a regenerative feedback loop comprising a crystal connected between said output and input terminals;

a relatively small value of capacitance connected between said output terminal and a point of reference potential; and a value of capacitance at least 10 times larger than said small value of capacitance connected between said input terminal and said point of reference potential.

2. An oscillator as set forth in claim 1, further including a voltage controlled capacitor in said regenerative feedback loop of a value such that when the operating voltage changes and tends to change the oscillator frequency in one sense, the capacitance changes in a sense and amount to change the oscillator frequency substantially the same amount in the opposite sense.

3. An oscillator as set forth in claim 2, wherein said voltage controlled capacitor comprises the distributed capacitance between the control electrode and the conduction path of each transistor.

* * * * *